United States Patent [19]

Hirajima et al.

[11] Patent Number: 5,673,046
[45] Date of Patent: Sep. 30, 1997

[54] ANALOG-TO-DIGITAL CONVERSION CIRCUIT FOR USE IN INFORMATION REPRODUCTION APPARATUSES

[75] Inventors: Hiroshige Hirajima, Tenri; Hiroshi Fuji, Kyoto; Tsuneo Fujiwara, Nara, all of Japan

[73] Assignee: Sharp Kabushiki Kaisha, Osaka, Japan

[21] Appl. No.: 294,357

[22] Filed: Aug. 23, 1994

[30] Foreign Application Priority Data

Aug. 25, 1993 [JP] Japan ................................ 5-210736

[51] Int. Cl.⁶ .......................... G11B 20/00; G11B 5/09
[52] U.S. Cl. .......................... 341/159; 341/110; 341/118
[58] Field of Search ................................ 341/156, 159, 341/118, 110, 132

[56] References Cited

U.S. PATENT DOCUMENTS 5,377,054 12/1994 Yamaguchi et al. ................ 360/39
5,422,642 6/1995 Chung et al. ........................ 341/118

FOREIGN PATENT DOCUMENTS 62-142484 6/1987 Japan .

Primary Examiner—Jeffrey A. Gaffin
Assistant Examiner—Peguy JeanPierre

[57] ABSTRACT

An A/D conversion circuit for use in an information reproduction apparatus, includes an envelope generator for extracting an upper-side envelope signal and a lower-side envelope signal from a reproduced signal read out from a recording medium, and an A/D converter for converting the reproduced signal into digital data by using a reference voltage that is obtained from a difference between an upper-side reference voltage and a lower-side reference voltage. In the analog-to-digital conversion circuit, the upper-side reference voltage is set to the level of the upper-side envelope signal, while the lower-side reference voltage is set to the level of the lower-side envelope signal. With this arrangement, the difference between the level of the upper-side envelope signal and the level of the lower-side envelope signal fluctuates together with an amplitude fluctuation component and a low-frequency superimposed component in a fluctuation of the reproduced signal. The reproduced signal is converted into digital data by using the difference as a reference voltage. This makes it possible to cancel the fluctuation of the reproduced signal. Thus, this arrangement makes it possible to obtain digital data free from deviations, as well as ensuring a proper response even to a quick fluctuation in the reproduced signal.

26 Claims, 8 Drawing Sheets

ANALOG-TO-DIGITAL CONVERSION CIRCUIT FOR USE IN INFORMATION REPRODUCTION APPARATUSES

FIELD OF THE INVENTION

The present invention relates to an A/D (analog to digital) conversion circuit for converting a reproduced signal from a recording medium into digital data, which is used in a reproduction circuit in an information reproduction apparatus or in an information recording-reproduction apparatus such as a magneto-optical disk apparatus.

BACKGROUND OF THE INVENTION

One of typical examples for information-reproducing methods in a magneto-optical disk apparatus is a binary coding method. This is a reproducing method wherein a maximum value and a minimum value in a reproduced signal are represented by binary digits of HIGH and LOW, using the center of the amplitude of the reproduced signal as a reference level. FIGS. 7(a) through 7(c) show one example where an A/D conversion circuit is adopted in this method.

More specifically, in this method, a maximum value and a minimum value in a reproduced signal 3 shown in FIG. 7(a) is A/D-converted by the use of a clock pulse 7 shown in FIG. 7(b), and the resulting digital values are compared with a digital value (80 h) that is obtained, for example, by A/D-converting a value (the upper-side reference voltage $V_{RT}$—the lower-side reference voltage $V_{RB}/2$). Thus, the maximum value and the minimum value are represented by HIGH and LOW.

However, the reflectance and the Kerr rotation angle of a magneto-optical disk are different depending on each magneto-optical disk, and they are also different depending on specific portions even on the same magneto-optical disk. For this reason, the amplitude of the reproduced signal 3 tends to fluctuate. Consequently, the digital values deviate as shown in FIG. 7(c). This means that the margin between the maximum value or the minimum value and the threshold value is reduced. When the amplitude of the reproduced signal 3 is small and the maximum value and the minimum value are distributed in the vicinity of the threshold value (that is, in the case of small margin), the possibility of errors tends to increase.

In order to reduce such deviations in digital data 26, Japanese Patent Publication No. 142484/1987 (Tokukaishou 62-142484) has disclosed an image-signal reproduction apparatus wherein (1) the amplitude fluctuation of the reproduced signal 3 is eliminated by the use of an automatic gain-control circuit (AGC), or (2) the envelope of the reproduced signal 3 is detected from the digital data 26, and the envelope is fed back to a reference voltage that is used upon conducting an A/D conversion.

However, in the arrangement of (1), although it is possible to eliminate the amplitude fluctuation component (peak-to-peak value) of the reproduced signal 3, it is difficult to eliminate the low-frequency superimposed component. For this reason, the arrangement fails to reduce the deviation of the digital data 26 sufficiently. Here, as shown in FIG. 8, the low-frequency superimposed component of the reproduced signal 3 refers to a fluctuation component of the reproduced signal 3 from which the amplitude fluctuation component has been excluded. The low-frequency superimposed component is comparatively small with respect to magnetic disks, but it is rather great with respect to optical disks such as magneto-optical disks.

Moreover, the disadvantage of the arrangement of (2) is that due to a long period of processing time, it fails to properly respond to a quick fluctuation in the reproduced signal 3.

SUMMARY OF THE INVENTION

It is an objective of the present invention to provide an A/D conversion circuit for converting a reproduced signal read from a recording medium into digital data, which is capable of properly responding to a quick fluctuation in the reproduced signal.

In order to achieve the above objective, the A/D conversion circuit used in an information reproduction apparatus in accordance with the present invention is provided with: an envelope generation means for extracting an upper-side envelope signal and a lower-side envelope signal from a reproduced signal read out from a recording medium; and an A/D converter for converting the reproduced signal into digital data by using a reference voltage that is obtained from a difference between an upper-side reference voltage and a lower-side reference voltage. This arrangement is characterized in that the upper-side reference voltage is set to the level of the upper-side envelope signal, while the lower-side reference voltage is set to the level of the lower-side envelope signal.

In accordance with the above arrangement, the difference between the level of the upper-side envelope signal and the level of the lower-side envelope signal fluctuates together with the amplitude fluctuation component and the low-frequency superimposed component in the fluctuation of the reproduced signal. The reproduced signal is converted into digital data by using the difference as a reference voltage. This makes it possible to cancel the fluctuation of the reproduced signal. Thus, this arrangement makes it possible to obtain digital data free from deviations, as well as ensuring a proper response even with regard to a quick fluctuation in the reproduced signal.

For a fuller understanding of the nature and advantages of the invention, reference should be made to the ensuing detailed description taken in conjunction with the accompanying drawings.

DESCRIPTION OF THE EMBODIMENTS

Referring to FIGS. 1 through 4, the following description will discuss the first embodiment of the present invention.

Figure 1:
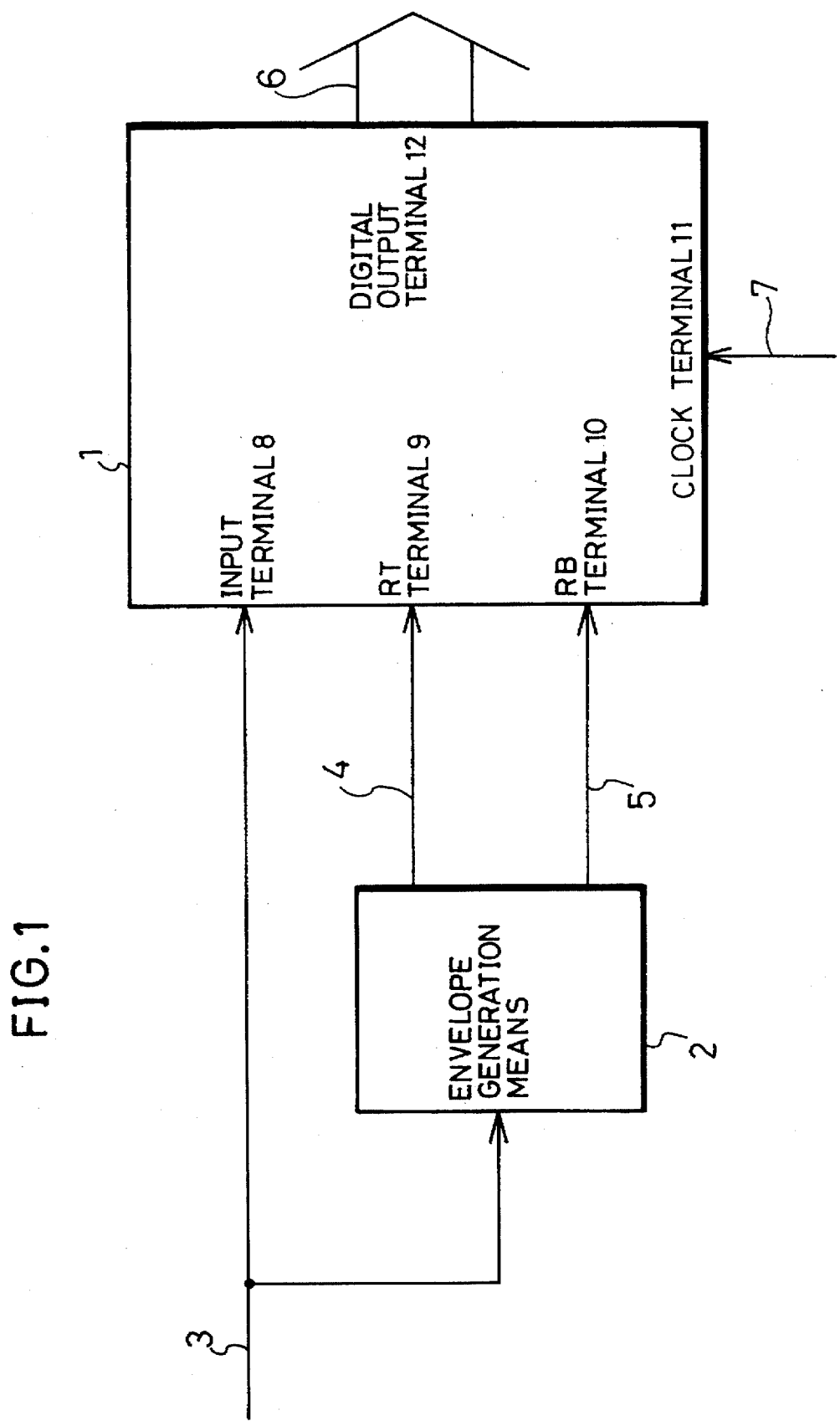
FIG. 1, which shows the first embodiment of the present invention, is a schematic block diagram showing a construction of an A/D conversion circuit.
Figure 2:
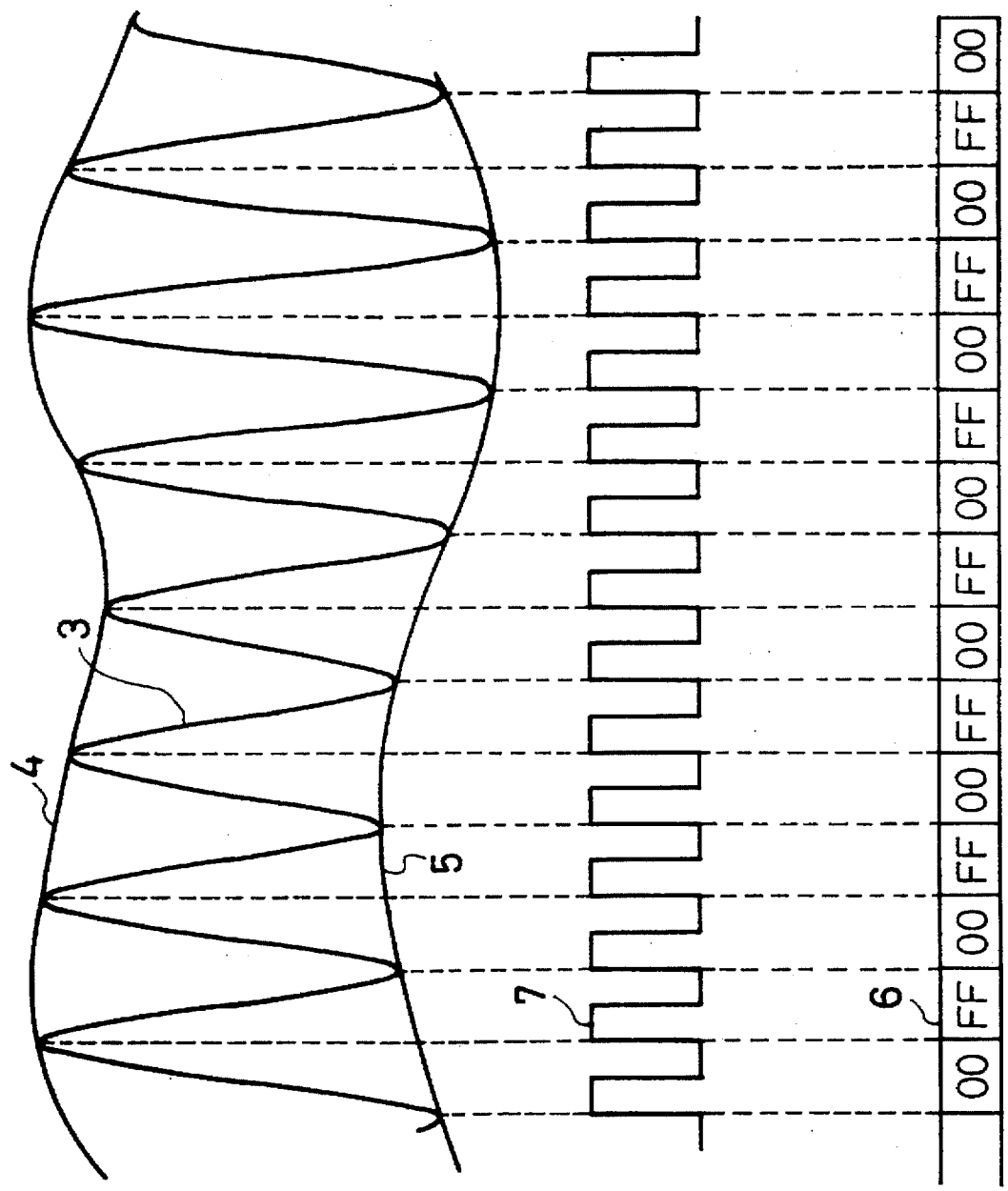
FIGS. 2(a) through 2(c) are explanatory drawings of waveforms that show an operation of the A/D conversion circuit of FIG. 1.

As illustrated in FIG. 1, the A/D conversion circuit for use in an information reproduction apparatus in accordance with the present embodiment is provided with: an envelope generator 2 for extracting an upper-side envelope signal 4 and a lower-side envelope signal 5 from a reproduced signal 3 read out from a recording medium (not shown) such as a magneto-optical disk; and an A/D converter 1 for converting the reproduced signal 3 into digital data 6 by using the level of the upper-side envelope signal 4 and the level of the lower-side envelope signal 5 respectively as an upper-side reference voltage and a lower-side reference voltage, while synchronizing to a clock pulse 7. Here, the clock pulse 7 is a pulse that is synchronous to a peak (maximum portion) and a bottom (minimum portion) of the reproduced signal 3.

In the above-mentioned arrangement, the reproduced signal 3, which has been read out from the recording medium, is inputted to the envelope generator 2 as well as to the input terminal 8 of the A/D converter 1. The envelope generator 2 extracts an upper-side envelope signal 4 and a lower-side envelope signal 5 (FIG. 2(a)) from the reproduced signal 3.

The upper-side envelope signal 4 and the lower-side envelope signal 5 are respectively inputted to an input terminal (RT terminal) 9 for the upper-side reference voltage and another input terminal (RB terminal) 10 for the lower-side reference voltage of the A/D converter 1. Further, the clock pulse 7 (FIG. 2(b)) is inputted to the clock terminal 11 of the A/D converter 1.

The reference voltage for use in A/D conversion is given as a difference between the upper-side reference voltage and the lower-side reference voltage. Therefore, the reference voltage fluctuates in accordance with the fluctuation of the reproduced signal 3. For this reason, independent of the amplitude fluctuation component and the low-frequency superimposed component in the fluctuation of the reproduced signal 3, it is possible to obtain optimum digital data 6, namely 00h, FFh, 00h, FFh, . . . , from the output terminal 12, as shown in FIG. 2(c).

Figure 3:
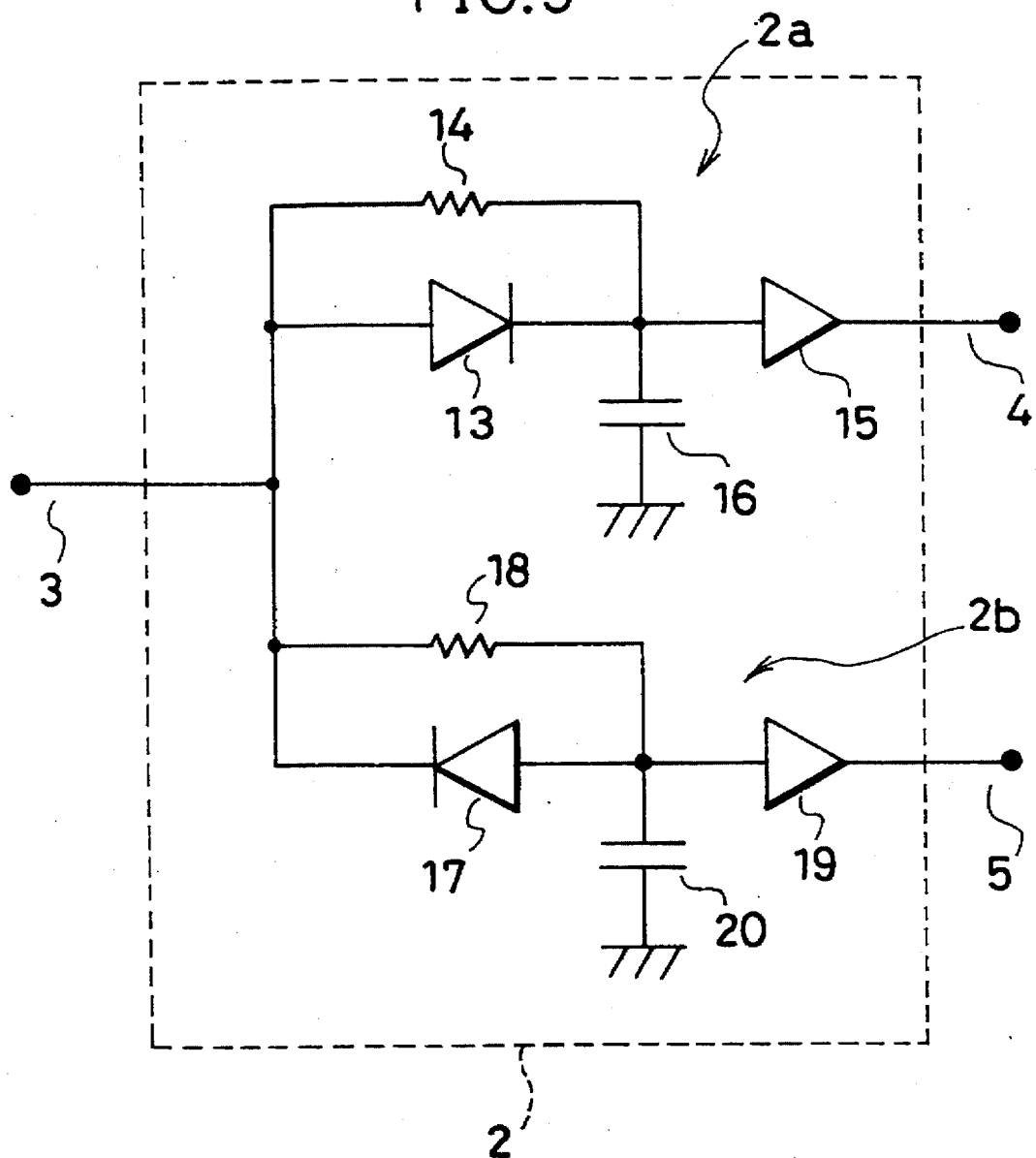
FIG. 3 is a block diagram showing one specific example of an envelope generation means in the A/D conversion circuit of FIG. 1.

More specifically, the envelope generator 2 is constituted of, for example, a generation circuit 2a for the upper-side envelope signal 4 and a generation circuit 2b for the lower-side envelope signal 5, as is shown in FIG. 3.

The generation circuit 2a for the upper-side envelope signal 4 has a diode 13, a resistor 14, a buffer 15, and a capacitor 16. The reproduced signal 3 is inputted to the anode of the diode 13. The cathode of the diode 13, which is connected to the input of the buffer 15, is also connected to ground through the capacitor 16. The resistor 14 is connected in parallel with the diode 13. The upper-side envelope signal 4 is released from the buffer 15.

The generation circuit 2b for the lower-side envelope signal 5 has a diode 17, a resistor 18, a buffer 19, and a capacitor 20. Except for the fact that the diode 17 is connected in a manner reversed to the diode 13, its construction is the same as the generation circuit 2a for the upper-side envelope signal 4.

In the above-mentioned arrangement, the upper side of the waveform of the reproduced signal 3 is transmitted through the diode 13, and its electric charge is stored in the capacitor 16. The cathode voltage increases in accordance with the anode voltage. By the time the voltage of the reproduced signal 3 has reached its peak, the capacitor 16 will have stored an electric charge corresponding to the peak voltage. Additionally, the diode 13, in its optimum state, has a property of allowing a current to pass from the anode to the cathode when the anode voltage is greater than the cathode voltage.

Next, when the voltage of the reproduced signal 3 drops from the peak voltage, the electric charge that has been stored in the capacitor 16 is discharged through the resistor 14 that is connected in parallel with the diode 13. The rate of discharge at this time is determined by the capacity C of the capacitor 16 and the resistance R of the resistor 14. When the rate of discharge is substantially slow in comparison with the rate of charge, the capacitor 16 maintains the peak voltage of the reproduced signal 3. The peak voltage is released through the buffer 15. In other words, a signal released from the buffer 15 corresponds to the upper-side envelope signal 4 of the reproduced signal 3.

The lower side of the waveform of the reproduced signal 3 is, on the other hand, transmitted through the diode 17, and its electric charge is stored in the capacitor 20. Thereafter, in accordance with the same principle as described above, the bottom voltage (downward peak voltage) of the reproduced signal 3 is released from the buffer 19. In other words, a signal released through the buffer 19 corresponds to the lower-side envelope signal 5 of the reproduced signal 3.

Figure 4:
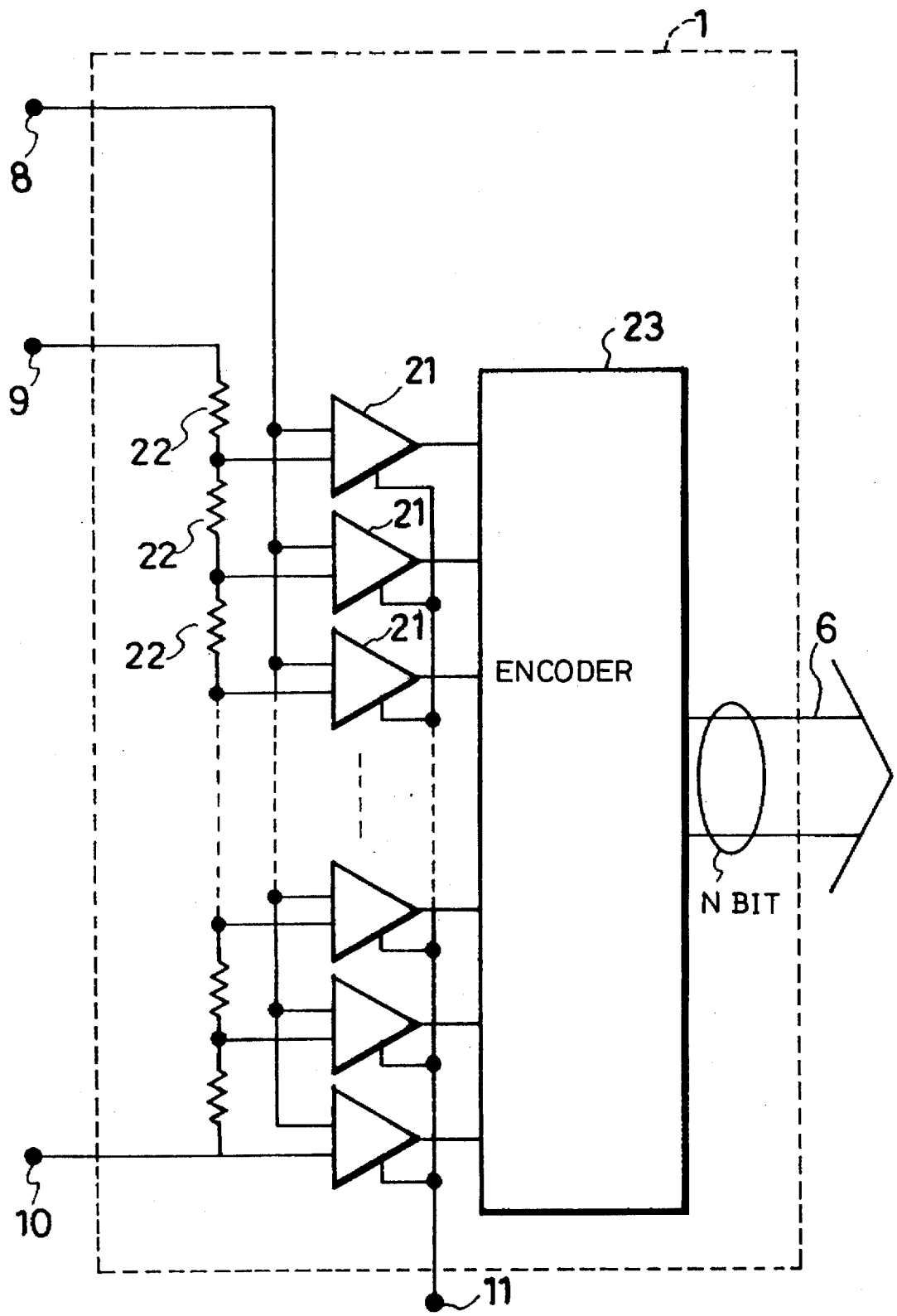
FIG. 4 is a block diagram showing one specific example of an A/D converter in the A/D conversion circuit of FIG. 1.

More specifically, as shown in FIG. 4, the A/D converter 1 is constituted of, for example, comparators 21 the number of which is given by ($2^N-1$), resistors 22 the number of which is given by ($2^N$ equal to one more than of comparators 21), and an encoder 23 which converts the outputs of the comparators 21 into digital data 6 (binary codes) of N bits. This type of A/D converter 1 is referred to as a flash type or as parallel type.

All the resistors 22 are connected in series with one another, and the ends of those resistors 22 are respectively connected to the RT terminal 9 and the RB terminal 10. All the timing terminals of the comparators 21 are connected to the clock terminal 11. One of the input terminals of each comparator 21 is connected to the input terminal 8 for the reproduced signal 3, and the other input terminal is connected to each connecting point between the resistors 22.

In this arrangement, the difference of electric potential between the RT terminal 9 and the RB terminal 10, that is, the reference voltage corresponding to the difference between the voltage of the upper-side envelope signal 4 and the voltage of the lower-side envelope signal 5, is divided by $2^N$ number of resistors 22 into $2^N$ number of equal portions. ($2^N-1$) number of voltages, which have been obtained through the voltage-dividing operation, are referred to as secondary reference voltages, and each voltage is inputted to one side of each comparator 21.

Each comparator 21 compares the reproduced signal 3 with the secondary reference voltage. When the voltage of the reproduced signal 3 is greater than the secondary reference voltage, the output of the comparator 21 goes "High", and when the voltage of the reproduced signal 3 is smaller than the secondary reference voltage, the output of the comparator 21 goes "Low". The outputs of the comparators 21 are converted into the digital data 6 by the encoder 23.

Figure 5:
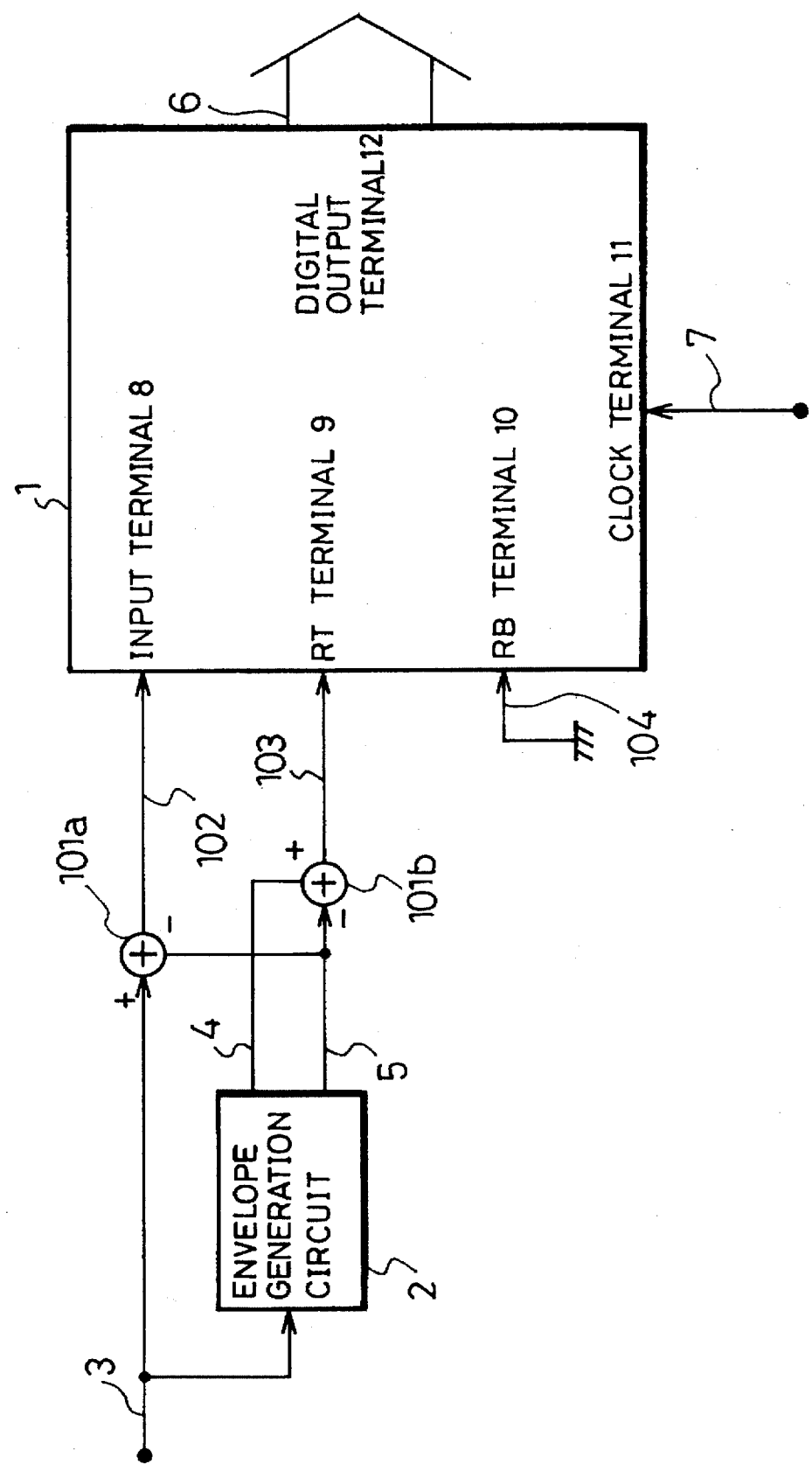
FIG. 5, which shows the second embodiment of the present invention, is a schematic block diagram showing a construction of an A/D conversion circuit.
Figure 6:
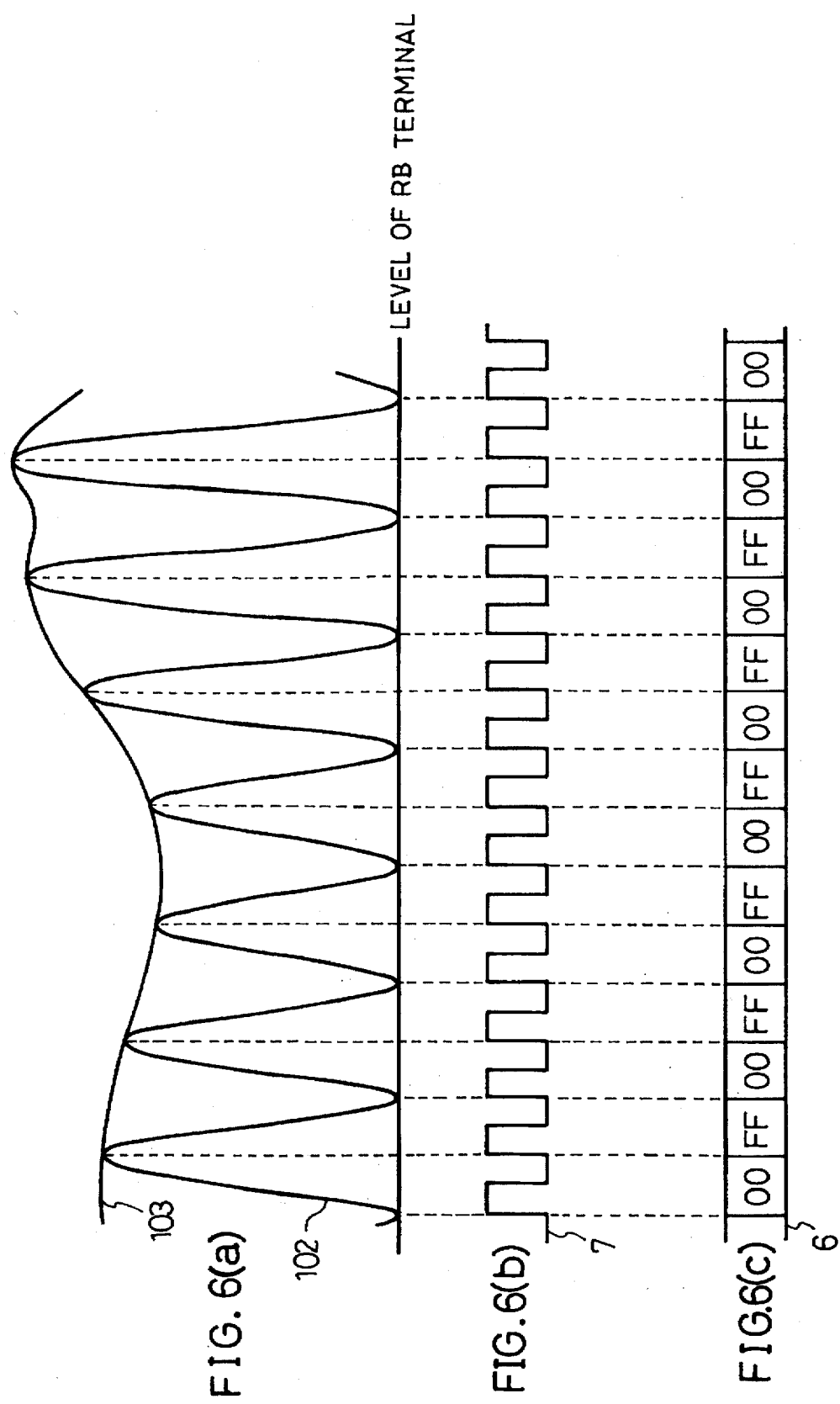
FIGS. 6(a) through 6(c) are explanatory drawings of waveforms that show an operation of the A/D conversion circuit of FIG. 5.
Figure 7:
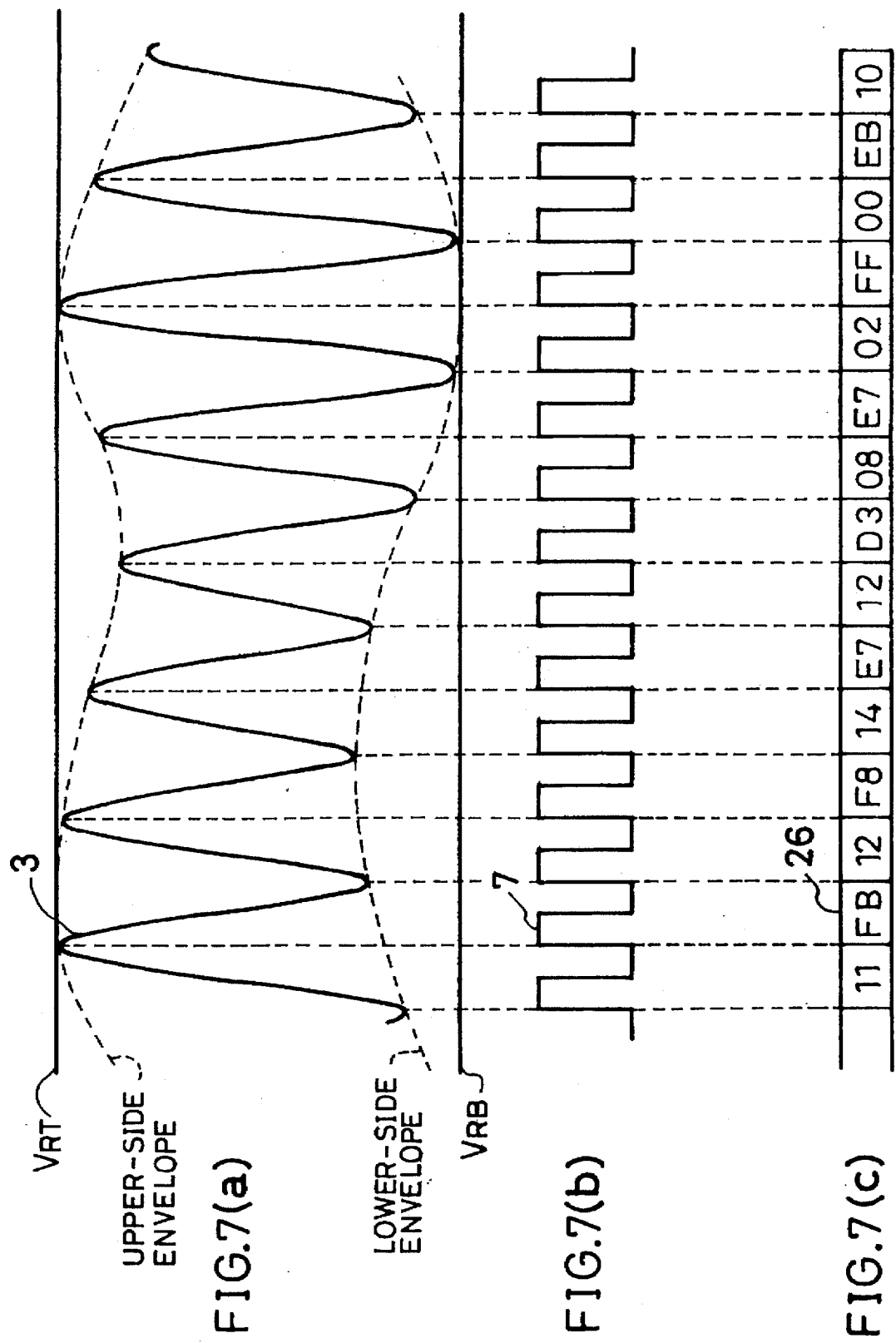
FIGS. 7(a) through 7(c) are drawings of waveforms that explains an operation of a conventional A/D conversion circuit.
Figure 8:
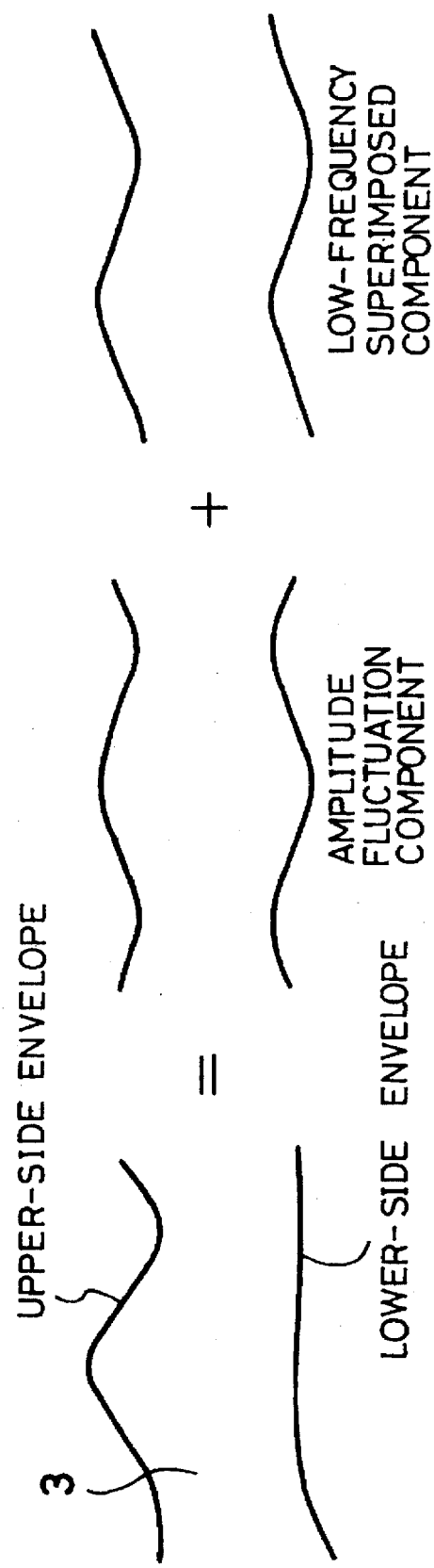
FIG. 8 is an explanatory drawing that shows an amplitude fluctuation component and a low-frequency superimposed component in a fluctuation of a reproduced signal.

Referring to FIGS. 5 and 6, the following description will discuss the second embodiment of the present invention. Here, for convenience of explanation, those members that have the same functions and that are described in the aforementioned embodiment by reference to the drawings thereof are indicated by the same reference numerals and the description thereof is omitted.

As illustrated in FIG. 5, the A/D conversion circuit for use in an information reproduction apparatus in accordance with the present embodiment is provided with: an envelope generator 2 for extracting an upper-side envelope signal 4 and a lower-side envelope signal 5 from a reproduced signal 3 read out from a recording medium (not shown) such as a magneto-optical disk; an adder circuit 101a (first adder circuit) for releasing a signal 102 obtained by subtracting the lower-side envelope signal 5 from the reproduced signal 3; and an adder circuit 101b (second adder circuit) for releasing a signal 103 obtained by subtracting the lower-side envelope signal 5 from the upper-side envelope signal 4; and an A/D converter 1 for converting the signal 102 into digital data 6 by using the level of the signal 103 and the ground level respectively as an upper-side reference voltage and a lower-side reference voltage, while synchronizing to a clock pulse 7. Here, the clock pulse 7 is a pulse that is synchronous to a peak (maximum portion) and a bottom (minimum portion) of the reproduced signal 3.

In the above-mentioned arrangement, the reproduced signal 3, which has been read out from the recording medium, is inputted to the envelope generator 2 as well as to the adder circuit 101a. The envelope generator 2 extracts an upper-side envelope signal 4 and a lower-side envelope signal 5 from the reproduced signal 3 in the same manner as described in the first embodiment.

The adder circuit 101a releases the signal 102 obtained by subtracting the lower-side envelope signal 5 from the reproduced signal 3, and the adder circuit 101b releases the signal 103 obtained by subtracting the lower-side envelope signal 5 from the upper-side envelope signal 4 (FIG. 6(a)). The signals 102 and 103 are respectively inputted to the input terminal 8 of the A/D converter 1 and the input terminal (RT terminal) 9 for the upper-side reference voltage. The input terminal (RB terminal) 10 for the lower-side reference voltage is set to the ground level. Further, the clock pulse 7 (FIG. 6(b)) is inputted to the clock terminal 11 of the A/D converter 1.

The reference voltage for use in A/D conversion is given as a difference between the upper-side reference voltage and the lower-side reference voltage, that is, the voltage of the signal 103. Therefore, the reference voltage fluctuates in accordance with the fluctuation of the signal 102. For this reason, independent of the amplitude fluctuation component and the low-frequency superimposed component in the fluctuation of the original reproduced signal 3, it is possible to obtain optimum digital data 6, namely 00h, FFh, 00h, FFh, . . . , from the output terminal 12, as shown in FIG. 6(c).

In the present embodiment, the level of the input terminal (RB terminal) 10 for the lower-side reference voltage is set to the ground level. Yet, the level is not necessarily set to the ground level, and may be set to any desired level. Moreover, instead of setting the level of the input terminal (RB terminal) 10 for the lower-side reference voltage, the level of the input terminal (RT terminal) 9 for the upper-side reference voltage may be set to a fixed level.

For this reason, in the present embodiment, the A/D converter 1 may not be restricted to the type wherein both the levels of the RT terminal 9 and the RB terminal 10 are freely set (for example, ADC-305-1; manufactured by Datel Co., Ltd.), but may also be a converter of another type wherein only either of the levels of the RT terminal 9 and the RB terminal 10 is freely set (for example, MB40558; manufactured by Fujitsu Limited). In other words, compared with the first embodiment, it is possible to provide a wide range of selection to the A/D converter 1.

In the first and second embodiments, the present invention has been explained by reference to the cases wherein information is reproduced by the A/D-converting of the peak voltage and the bottom voltage of the reproduced signal 3. However, the present invention may be applied to cases wherein information is reproduced by the A/D-converting of a plurality of voltages located between the peak voltage and the bottom voltage, such as seen in the partial-response detecting method.

Moreover, the A/D conversion circuit of the present invention may be applied not only to magneto-optical disk apparatuses, but also to information recording-reproduction apparatuses and information reproduction apparatuses, such as WORM-type (Write-Once-Read-Many type) optical disk apparatuses, optical card apparatuses, and optical tape apparatuses. In those apparatuses, the A/D conversion circuit makes it possible to quickly respond to the amplitude fluctuation component and the low-frequency superimposed component in the fluctuation of the reproduced signal 3. Further, because of a simple construction, it is easy to realize the construction. Furthermore, it is operated by the feedforward control; therefore, there is no possibility of transmitting errors. Thus, the A/D conversion circuit ensures accurate digital data 6.

Moreover, when the present invention is applied to information recording-reproduction apparatuses and information reproduction apparatuses, such as magnetic disk apparatuses, other than optical recording-reproduction apparatuses and optical reproduction apparatuses, it is possible to eliminate the amplitude fluctuation from the reproduced signal 3.

As described above, the A/D conversion circuit for use in an information reproduction apparatus in accordance with the present invention is provided with: an envelope generator 2 for extracting an upper-side envelope signal 4 and a lower-side envelope signal 5 from a reproduced signal 3 read out from a recording medium; and an A/D converter 1 for converting the reproduced signal 3 into digital data 6 by using a reference voltage that is obtained from a difference between the level of the upper-side envelope signal 4 and the level of the lower-side envelope signal 5.

In accordance with the above arrangement, the difference between the level of the upper-side envelope signal 4 and the level of the lower-side envelope signal 5 fluctuates together with the amplitude fluctuation component and the low-frequency superimposed component in the fluctuation of the reproduced signal 3. The reproduced signal 3 is converted into digital data 6 by using the difference as a reference voltage; this makes it possible to cancel the fluctuation of the reproduced signal 3. Thus, this arrangement makes it possible to obtain digital data 6 free from deviations, as well as ensuring a proper response even to a quick fluctuation in the reproduced signal 3. Moreover, since the envelope generator 2 is realized by using a simple circuit construction, it becomes possible to miniaturize the A/D conversion circuit.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An analog-to-digital conversion circuit for use in an information reproduction apparatus, comprising:
   envelope generation means for extracting an upper-side envelope signal and a lower-side envelope signal from a reproduced signal reproduced from a recording medium; and
   an analog-to-digital converter for converting the reproduced signal into digital data by using a reference voltage that is obtained from a difference between an upper-side reference voltage and a lower-side reference voltage, the upper-side reference voltage being set to the level of the upper-side envelope signal and the lower-side reference voltage being set to the level of the lower-side envelope signal, wherein the analog-to-digital converter includes, a plurality of resistors for dividing the reference voltage into a plurality of secondary reference voltages, a plurality of comparators, each for comparing the reproduced signal with one of the secondary reference voltages and for generating an output, and an encoder for converting the outputs from the plurality of comparators into digital data.

2. The analog-to-digital conversation circuit of claim 1, wherein the envelope generation means comprises:

an upper-side envelope signal generation circuit for maintaining a peak voltage of the reproduced signal and then releasing the peak voltage to extract the upper-side envelope signal; and a lower-side envelope signal generation circuit for maintaining a bottom voltage of the reproduced signal and then releasing the bottom voltage to extract the lower-side envelope signal.

3. The analog-to-digital conversion circuit of claim 1, wherein the analog-to-digital converter converts the reproduced signal into the digital data in accordance with a clock pulse that is synchronous with a peak and a bottom of the reproduced signal.

4. The analog-to-digital conversion circuit of claim 3, wherein the analog-to-digital converter is of a flash type.

5. The analog-to-digital conversion circuit of claim 1, wherein the recording medium is an optical recording medium.

6. The analog-to-digital conversion circuit of claim 5, wherein the optical recording medium is a magneto-optical disk.

7. The analog-to-digital converter of claim 1, wherein the plurality of resistors are connected in series.

8. The analog-to-digital conversion circuit for use in an information reproduction apparatus comprising:

an envelope generation means for extracting an upper-side envelope signal and a lower-side envelope signal from a reproduced signal reproduced from a recording medium;

a first circuit for subtracting the extracted lower-side envelope signal from the reproduced signal and producing a first output signal;

a second circuit for subtracting the extracted lower-side envelope signal from the extracted upper-side envelope signal and producing a second output signal; and an analog-to-digital converter for converting the first output signal from the first circuit into digital data by using a reference voltage obtained from a difference between an upper-side reference voltage and a lower-side reference voltage, wherein one of the upper-side reference voltage and the lower-side reference voltage is set to a level of the second output signal from the second circuit and the other reference voltage is set to a predetermined fixed level.

9. The analog-to-digital conversion circuit of claim 8, wherein the upper-side reference voltage is set to a level of the second output signal from the second circuit.

10. The analog-to-digital conversion circuit of claim 9, wherein the predetermined fixed level is a ground level.

11. The analog-to-digital conversion circuit of claim 8, wherein the envelope generation means comprises:

an upper-side envelope signal generation circuit for maintaining a peak voltage of the reproduced signal and then releasing the peak voltage to extract the upper-side envelope signal; and a lower-side envelope signal generation circuit for maintaining a bottom voltage of the reproduced signal and then releasing the bottom voltage to extract the lower-side envelope signal.

12. The analog-to-digital conversion circuit of claim 8, wherein the analog-to-digital converter converts the first output signal into the digital data in accordance with a clock pulse that is synchronous with a peak and a bottom of the reproduced signal.

13. The analog-to-digital conversion circuit of claim 12, wherein the analog-to-digital converter is of a flash type.

14. The analog-to-digital conversion circuit of claim 8, wherein the recording medium is an optical recording medium.

15. The analog-to-digital conversion circuit of claim 14, wherein the optical recording medium is a magneto-optical disk.

16. The analog-to-digital conversion circuit of claim 8, wherein the analog-to-digital converter includes, a plurality of resistors for dividing the reference voltage into a plurality of secondary reference voltages, a plurality of comparators, each for comparing the reproduced signal with one of the secondary reference voltages and for generating an output, and an encoder for converting outputs from the plurality of comparators into digital data.

17. The analog-to-digital converter of claim 16, wherein the plurality of resistors are connected in series.

18. An analog-to-digital conversion circuit for use in an information reproduction apparatus, comprising:

envelope generation means for extracting an envelope signal from a reproduced signal that has been read from a recording medium; and an analog-to-digital converter for converting the reproduced signal into digital data, the analog-to-digital converter including an input terminal for receiving an input reference voltage and an input terminal for receiving the reproduced signal, wherein the extracted envelope signal is inputted to the reference voltage input terminal of the analog-to-digital converter.

19. The analog-to-digital conversion circuit of claim 18, wherein the analog-to-digital converter includes, a plurality of resistors for receiving the input reference voltage so as to divide the input reference voltage into a plurality of secondary reference voltages, a plurality of comparators, each for comparing the reproduced signal with one of the secondary reference voltages and for generating an output, and an encoder for converting outputs from the plurality of comparators into digital data.

20. The analog-to-digital converter of claim 19, wherein the plurality of resistors are connected in series.

21. The analog-to-digital conversation circuit of claim 18, wherein the envelope generation means comprises:

an upper-side envelope signal generation circuit for maintaining a peak voltage of the reproduced signal and then releasing the peak voltage to extract the upper-side envelope signal; and a lower-side envelope signal generation circuit for maintaining a bottom voltage of the reproduced signal and then releasing the bottom voltage to extract the lower-side envelope signal.

22. The analog-to-digital conversion circuit of claim 18, wherein the analog-to-digital converter converts the reproduced signal into the digital data in accordance with a clock pulse that is synchronous with a peak and a bottom of the reproduced signal.

23. The analog-to-digital conversion circuit of claim 22, wherein the analog-to-digital converter is of a flash type.

24. The analog-to-digital conversion circuit of claim 18, wherein the recording medium is an optical recording medium.

25. The analog-to-digital conversion circuit of claim 24, wherein the optical recording medium is a magneto-optical disk.

26. An analog-to-digital conversion method, comprising the steps of:

(a) extracting an upper-side envelope signal from a reproduced signal, reproduced from a recording medium;

(b) extracting a lower-side envelope signal from the reproduced signal; and (c) converting the reproduced signal into digital data using the extracted upper-side envelope signal and the extracted lower-side envelope signal, step (c) including the substeps of, and the extracted lower-side envelope-signal, (c1) generating a plurality of secondary reference voltages from a difference between the extracted upper-side envelope signal and the extracted lower-side envelope signal, (c2) comparing the reproduced signal with each of the plurality of generated secondary reference voltages and generating a plurality of respective outputs, and (c3) converting the plurality of respective outputs into digital data.

* * * * *